US011367937B2

(12) United States Patent
Dogiamis et al.

(10) Patent No.: US 11,367,937 B2
(45) Date of Patent: Jun. 21, 2022

(54) WAVEGUIDES WITH ACTIVE OR PASSIVE REPEATERS FOR RANGE EXTENSION

(71) Applicant: Intel Corporation, Santa Clara, CA (US)

(72) Inventors: Georgios Dogiamis, Chandler, AZ (US); Sasha Oster, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 442 days.

(21) Appl. No.: 16/464,673

(22) PCT Filed: Dec. 30, 2016

(86) PCT No.: PCT/US2016/069543
§ 371 (c)(1),
(2) Date: May 28, 2019

(87) PCT Pub. No.: WO2018/125228
PCT Pub. Date: Jul. 5, 2018

(65) Prior Publication Data
US 2019/0319328 A1    Oct. 17, 2019

(51) Int. Cl.
*H01P 3/16* (2006.01)
*H01P 3/08* (2006.01)
(Continued)

(52) U.S. Cl.
CPC ............... *H01P 3/16* (2013.01); *H01P 3/081* (2013.01); *H03F 3/19* (2013.01); *H03H 11/04* (2013.01);
(Continued)

(58) Field of Classification Search
CPC ......... H01P 3/16; H01P 3/081; H05K 1/0237; H05K 7/1492
(Continued)

(56) References Cited

U.S. PATENT DOCUMENTS

| 2015/0277065 A1 | 10/2015 | Wertsberger et al. | |
| 2016/0064794 A1* | 3/2016 | Henry | H04B 3/38 |
| | | | 333/240 |

(Continued)

OTHER PUBLICATIONS

International Search Report and Written Opinion for International Patent Application No. PCT/US2016/069543 dated Sep. 27, 2017, 13 pgs.
(Continued)

*Primary Examiner* — Sherman Ng
(74) *Attorney, Agent, or Firm* — Schwabe, Williamson & Wyatt, P.C.

(57) ABSTRACT

Embodiments of the invention may include a mm-wave waveguide. In an embodiment, the mm-wave waveguide may include a first dielectric waveguide and a second dielectric waveguide. A conductive layer may be used to cover the first dielectric waveguide and the second dielectric waveguide in some embodiments. Furthermore, embodiments may include a repeater communicatively coupled between the first dielectric waveguide and the second dielectric waveguide. In an embodiment, the repeater may be an active repeater or a passive repeater. According to an embodiment, a passive repeater may be integrated within the dielectric waveguide. The passive repeater may include a dispersion compensating material that produces a dispersion response in a signal that is substantially opposite to a dispersion response produced when the signal is propagated along the dielectric waveguide.

25 Claims, 7 Drawing Sheets

(51) Int. Cl.
*H03F 3/19* (2006.01)
*H03H 11/04* (2006.01)
*H05K 1/02* (2006.01)
*H05K 1/18* (2006.01)
*H05K 7/14* (2006.01)

(52) U.S. Cl.
CPC ........... *H05K 1/0237* (2013.01); *H05K 1/181* (2013.01); *H03F 2200/451* (2013.01); *H05K 7/1492* (2013.01)

(58) Field of Classification Search
USPC ........................................................ 361/783
See application file for complete search history.

(56) References Cited

U.S. PATENT DOCUMENTS

| | | |
|---|---|---|
| 2016/0197630 A1 | 7/2016 | Kawasaki |
| 2016/0261309 A1 | 9/2016 | Henry et al. |
| 2016/0261310 A1 | 9/2016 | Fuchs et al. |
| 2016/0365916 A1 | 12/2016 | Bennett et al. |
| 2018/0210079 A1* | 7/2018 | Hammerschmidt .. G01S 13/931 |

OTHER PUBLICATIONS

International Preliminary Report on Patentability for International Patent Application No. PCT/US2016/069543 dated Jul. 11, 2019, 9 pgs.

* cited by examiner

WAVEGUIDES WITH ACTIVE OR PASSIVE REPEATERS FOR RANGE EXTENSION

CROSS-REFERENCE TO RELATED APPLICATION

This patent application is a U.S. National Phase Application under 35 U.S.C. § 371 of International Application No. PCT/US2016/069543, filed Dec. 30, 2016, entitled "WAVEGUIDES WITH ACTIVE OR PASSIVE REPEATERS FOR RANGE EXTENSION," which designates the United States of America, the entire disclosure of which is hereby incorporated by reference in its entirety and for all purposes.

FIELD OF THE INVENTION

Embodiments of the invention are in the field of interconnect technologies and, in particular, formation of mm-wave waveguides that include active or passive repeaters that extend the range of the mm-wave waveguides.

BACKGROUND OF THE INVENTION

As more devices become interconnected and users consume more data, the demand on improving the performance of servers has grown at an incredible rate. One particular area where server performance may be increased is the performance of interconnects between components, because there are many interconnects within server and high performance computing (HPC) architectures today. These interconnects include within blade interconnects, within rack interconnects, and rack-to-rack or rack-to-switch interconnects. In order to provide the desired performance, these interconnects may need to have increased data rates and switching architectures which require longer interconnects. Furthermore, due to the large number of interconnects, the cost of the interconnects and the power consumption of the interconnects should both be minimized. In current server architectures, short interconnects (e.g., within rack interconnects and some rack-to-rack) are achieved with electrical cables, such as ethernet cables, co-axial cables, or twin-axial cables, depending on the required data rate. For longer distances (e.g., greater than five meters), optical solutions are employed due to the long reach and high bandwidth enabled by fiber optic solutions.

However, as new architectures emerge, such as 100 Gigabit Ethernet, traditional electrical connections are becoming increasingly expensive and power hungry to support the required data rates for short (e.g., 2 meters to 5 meters) interconnects. For example, to extend the length of a cable or the given bandwidth on a cable, higher quality cables may need to be used or advanced equalization, modulation, and/or error correction techniques employed. Accordingly, these solutions require additional power and increase the latency to the system. Optical transmission over fiber is capable of supporting the required data rates and distances, but at a severe power and cost penalty, especially for short to medium distances (e.g., a few meters) due to the need for optical interconnects.

For some distances and data rates required in proposed architectures, there is no viable electrical solution today. For medium distance communication in a server farm, the overhead power associated with the optical fiber interconnects is too high, whereas the required error correction on traditional electrical cables creates a substantial latency (e.g., several hundred nanoseconds). This makes both technologies (traditional electrical and optical) not particularly optimal for emerging rack-scale architectures (RSA) servers including HPCs, where many transmission lines range between 2 and 5 meters.

One proposed interconnect technology that may provide high data rates with lower power consumption is mm-wave waveguides. mm-wave waveguides propagate mm-wave signals along a dielectric waveguide. Dielectric waveguides are beneficial because there is no need for forward error correction and power is conserved since there is no power intensive electrical to optical conversion. However, the propagation of mm-waves along a dielectric cable may be loss-limited if the incurred dispersion over the length of the channel is not significant (typically in pure dielectric waveguides), or may be dispersion limited if the incurred dispersion over the length of the channel is significant (typically in metal air core waveguides). Dispersion describes the phenomenon that not all frequencies have the same velocity as they are propagated through the dielectric material. Accordingly, in longer mm-wave waveguides the signal may incur excessive dispersion and spread too much, therefore becoming difficult to decode at the receiving end.

DETAILED DESCRIPTION OF THE INVENTION

Described herein are systems that include active and passive repeaters that may be used in conjunction with mm-wave waveguides to extend the range of the mm-wave waveguide. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, mm-wave waveguides may be dispersion limited, and not all frequencies are propagated at the same velocity. This results in the signal spreading as it is propagated along the mm-wave waveguide. For a signal with a given bandwidth, signal spreading limits the length of the mm-wave waveguide. Alternatively, longer mm-wave waveguides may be used, but the bandwidth of the signal must be reduced and the data rate along the dielectric waveguide is limited. For example, at a desired bandwidth of 50 GHz (i.e., 90 GHz to 140 GHz), current mm-wave waveguides may be limited to lengths of approximately 5 meters.

Accordingly, embodiments of the invention include active repeaters or passive repeaters that are used to compensate for the dispersion of the signal. In such embodiments, the active or passive repeater may link together short to medium length (e.g., 1 meter to 5 meter) portions of a mm-wave waveguide. As the signal is propagated along the first portion of the mm-wave waveguide, the signal may suffer from dispersion. When the signal is passed through the active or passive repeater, the signal is modified to correct the dispersion in order to substantially return the signal to its original state before being transmitted through the second portion of the mm-waveguide.

The use of active or passive repeaters in conjunction with mm-wave waveguides allows for interconnects that are longer than approximately 5 meters. As such, the cost of the overall server farm system may be reduced since long (e.g., greater than approximately 5 meters) and expensive optical fibers may be replaced with the lower cost mm-wave waveguide interconnects. Additionally, since mm-wave waveguides with repeaters reduce the number of optical interconnects used in the server farm there is a reduction in the overall power consumption since there is no longer a need for a power intensive electrical to optical conversion. The power savings is even greater when passive repeaters are used, because passive repeaters may not require any additional power in order to extend the range of the mm-wave waveguides.

Embodiments of the invention include both active and passive repeaters. Active repeaters may utilize a die that includes circuitry that implements a dispersion compensation technique. For example, the dispersion compensation technique may be implemented by analog filters that have a negative dispersion response compared to the mm-wave waveguide. Accordingly, the signal will be compensated and can travel another short to medium distance along a second portion of the mm-wave waveguide. Passive repeaters may utilize a structure that includes transmission lines (e.g., microstrip lines) that have a negative dispersion response compared to the mm-wave waveguide. For example, the transmission lines may include uniform or chirped microstrip lines to provide the dispersion compensation. Alternative embodiments include passive repeaters that utilize dispersion compensating materials that are integrated into the mm-wave waveguide. For example, the dispersion compensating material may be a metamaterial.

Figure 1A:
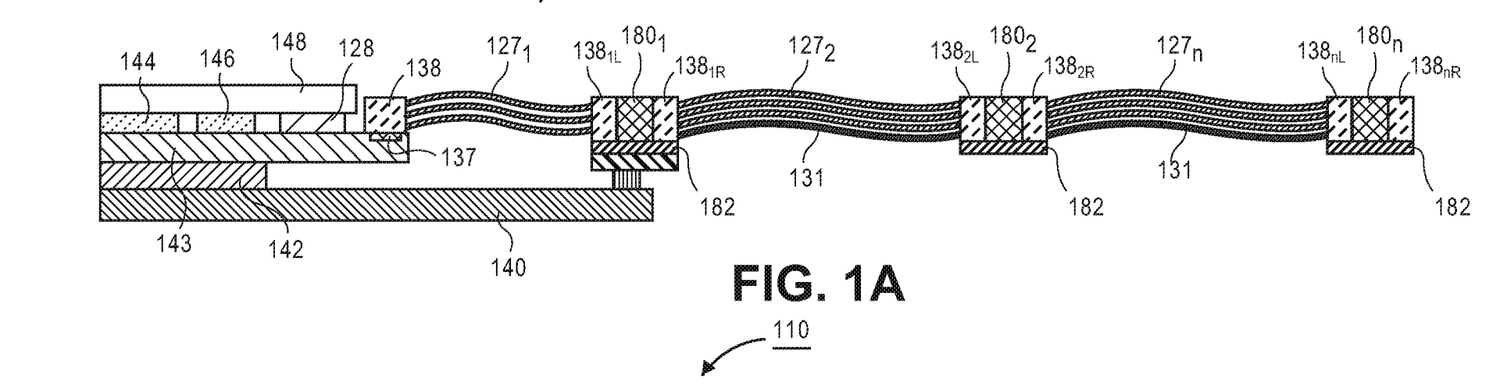
FIG. 1A is a cross-sectional illustration of a mm-wave waveguide with active repeaters that is attached to a server, according to an embodiment of the invention.

Referring now to FIG. 1A, a cross-sectional illustration of a server that is coupled to a mm-wave waveguide that includes an active repeater is shown, according to an embodiment of the invention. In an embodiment, the server 110 may include a central processing unit (CPU) die 144 that is packaged on a packaging substrate 143. The packaging substrate 143 may be coupled to the server printed circuit board (PCB) 140 by a socket 142, land grid array (LGA), or ball grid array (BGA), or any other know interconnect. In some embodiments, a predefined digital interconnect interface die 146 and a mm-wave engine 128 may also be packaged on the same packaging substrate 143 on which the CPU die 144 is packaged. In an embodiment, the predefined digital interconnect interface die 146 may translate and/or condition a signal so that signals may pass between the CPU die 144 and the mm-wave engine 128 even when the output of either of the CPU die 144 or the mm-wave engine 128 does not match the type of input expected by the other component. In some embodiments a heatsink 148 or any other thermal management technology may also be included in the server 110. In the illustrated embodiment, the enclosure of the server 110 is not shown in order to not obscure the Figure, but it is to be appreciated that an enclosure may surround the components of the server 110.

Figure 1B:
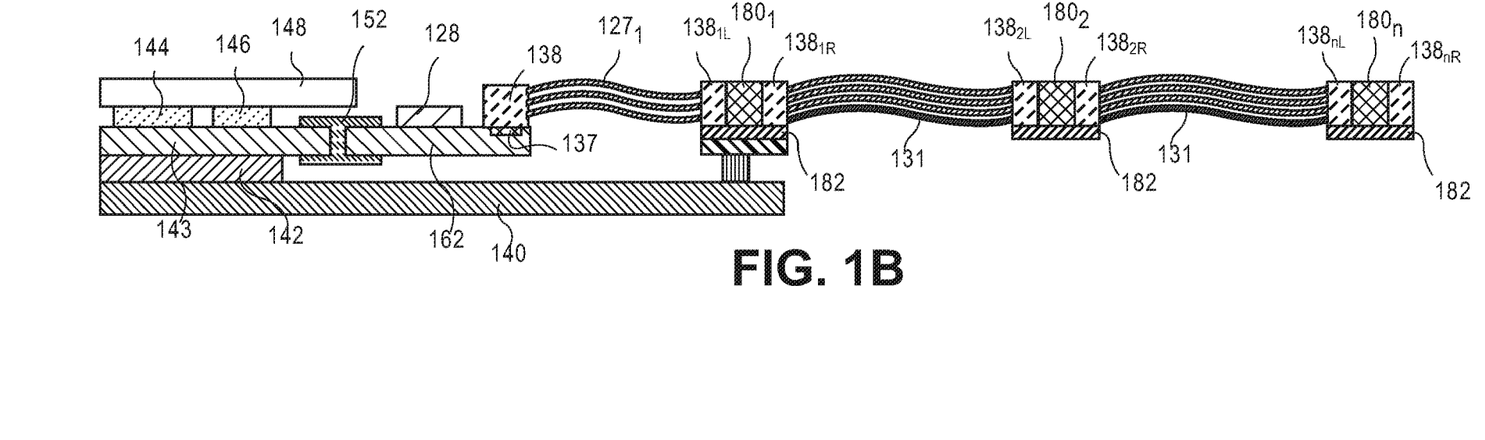
FIG. 1B is a cross-sectional illustration of a mm-wave waveguide with active repeaters that is attached to a server, according to an additional embodiment of the invention.

According to an embodiment, other server architectures may also utilize a mm-wave waveguide with one or more repeaters. For example, FIG. 1B is a cross-section illustration of a server system 110 with a mm-wave engine 128 packaged within the server 110 where the mm-wave engine 128 is packaged on a different packaging substrate than the CPU. In an embodiment, the mm-wave packaging substrate 162 may be coupled to the CPU packaging substrate 143 by a predefined digital interface 152. As such, the mm-wave packaging substrate 162 is independent of the CPU packaging substrate 143, and allows for the use of mm-wave appropriate substrates and stack ups. This may enable better performance of the mm-wave system than direct integration with the CPU package 143.

Figure 1C:
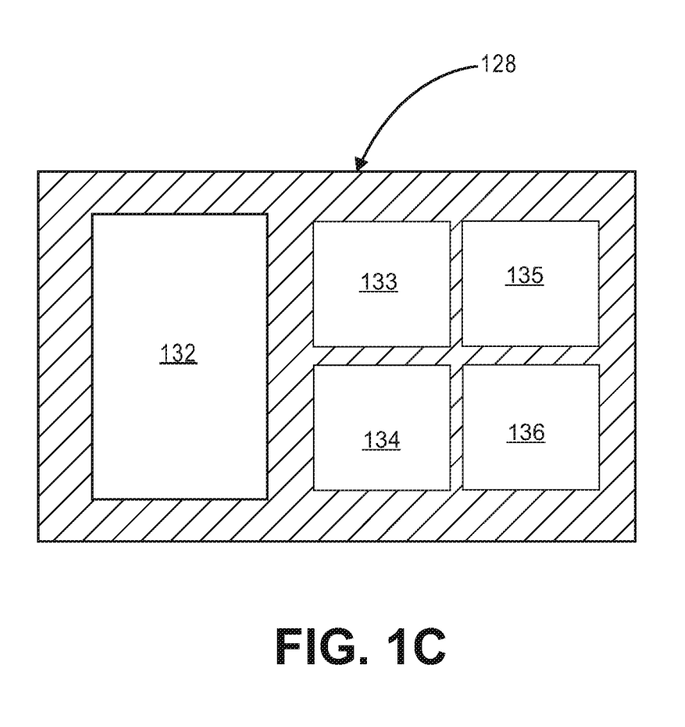
FIG. 1C is a schematic illustration of a mm-wave engine that may be used in a server, according to an embodiment of the invention.

Referring ahead to FIG. 1C, a schematic illustration of a mm-wave engine 128 is shown in more detail, according to an embodiment of the invention. In an embodiment, the mm-wave engine 128 may include a power supply and management die 132. Additional embodiments may include a modulator die 133 and a demodulator die 134. In some embodiments, the modulator die 133 and the demodulator die 134 may be integrated on a single die. Embodiments may also include a mm-wave transmitter (Tx) die 135 and a mm-wave receiver (Rx) die 136. In some embodiments the Tx die 135 and the Rx die 136 may be integrated on a single die. Additional embodiments may also include any number of components being integrated on a single die. In another embodiment, the mm-wave engine 128 may be a transmitting mm-wave engine or a receiving mm-wave engine 128. In such embodiments, the transmitting mm-wave engine may include a Tx die 135 and a modulator die 133 and the receiving mm-wave engine may include an Rx die 136 and a demodulator die 134. The components may also be formed on any suitable semiconductor material. For example, the dies may be silicon dies, III-V material dies, silicon on insulator (SOI) dies, III-V materials integrated on a single die with silicon, or any other combination of semiconductor materials.

Returning now to FIG. 1A, the mm-wave engine 128 may be communicatively coupled to a mm-wave launcher 137 and mm-wave connector 138. The launcher 137 may be used to launch and assist the propagation of the mm-wave signal along the mm-wave waveguides 127. In some embodiments, the launcher 137 may be integrated with a waveguide connector 138 that mechanically and communicatively couples the mm-wave waveguide 127 to the launcher 137. The launcher 137 may be any known launcher for initiating the propagation of mm-waves or receiving mm-waves, such as a regular patch launcher, a stacked-patch launcher, a microstrip-to-slot transition launcher, etc. While illustrated as being located on a top surface of the packaging substrate 143, it is to be appreciated that the waveguide connector 138 and the launcher 137 may be formed at any location, including the bottom surface of the packaging substrate 143 or embedded within the packaging substrate 143. In an additional embodiment, the waveguide connector 138 and/or the launcher 137 may be overmolded.

In the illustrated embodiment, three mm-waveguides 127 are coupled to the mm-waveguide connector 138, though embodiments are not limited to such configurations. For example, a single mm-wave waveguide $127_1$ may be coupled to the mm-waveguide connector 138 or two or more mm-wave waveguides 127 may be coupled to the mm-waveguide connector 138. In an embodiment, the mm-wave waveguides 127 may be any suitable dielectric material, such as liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA), combinations thereof, or the like. In an embodiment, the mm-wave waveguides 127 may also include a conductive coating (not show) to provide electrical shielding to the dielectric waveguide.

In order to increase the length of the mm-wave waveguide, embodiments of the invention may include one or more repeaters formed between sections of the mm-wave waveguide. The repeaters 180 allow for the total length (i.e., the combined length of all mm-wave waveguides 127 that are connected to each other by repeaters 180) of the mm-wave waveguide to be increased, because the repeaters compensate for the dispersion of the signal. For example, a first mm-wave waveguide $127_1$ may extend to the edge of the server 110 where it connects to a first repeater $180_1$. A second mm-wave waveguide $127_2$ may extend out from the server 110 and be coupled to an additional mm-wave waveguide $127_n$ by a second repeater $180_2$. According to an embodiment, the repeating pattern of mm-wave waveguides 127 connected to a repeater 180 may continue any number of times in order to provide the desired total length. For example, each of the mm-wave waveguides may be short to medium length interconnects (e.g., 0.5 meters to approximately 5.0 meters), and the use of repeaters 180 may allow for substantially longer total lengths. For example, the total length of the mm-wave waveguide (i.e., the combined length of all of the mm-wave waveguides 127) may be 10 meters or greater.

According to an embodiment, the repeaters 180 may be communicatively coupled to the mm-wave waveguides 127 by a mm-waveguide connector 138 and a launcher (not shown). The repeaters 180, the mm-waveguide connector 138 and the launcher may be packaged on a repeater substrate 182. In an embodiment, one or more of the repeaters 180, the mm-waveguide connector 138, and the launcher may be formed on a top surface of the repeater substrate 182, a bottom surface of the repeater substrate 182, embedded within the substrate 182, or be overmolded.

In an embodiment, the repeater 180 may be an active repeater. In such an embodiment, the repeater 180 may require a source of power to implement the dispersion compensation. Accordingly, embodiments may also include one or more power lines 131 that electrically couple each of the repeaters 180 to a power source. In an embodiment, the power lines 131 may be bundled with mm-wave waveguides 127 and the power source may be the server. Alternative embodiments may include a power line 131 that is electrically coupled to other infrastructure within a datacenter.

Figure 1D:
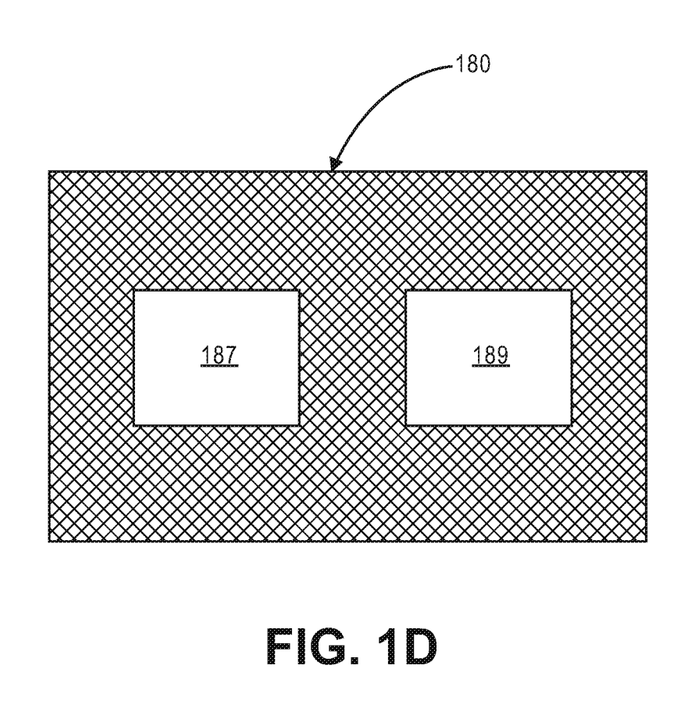
FIG. 1D is a schematic illustration of components in an active repeater that may be used to extend the range of a mm-wave waveguide, according to an embodiment of the invention.

According to an embodiment, the active repeaters 180 may include one or more semiconducting dies. A schematic illustration of an active repeater 180 formed in accordance with an embodiment of the invention is shown in FIG. 1D. In an embodiment, an active repeater 180 may utilize a dispersion compensation technique directly in the RF frequencies without the need to down convert the mm-wave signal. The dispersion compensation may be implemented with one or more analog filters 187 that operate at RF frequencies that have a negative dispersion response compared to the mm-wave waveguide. As the signal passes through the analog filters 182 the signal will be filtered to compensate for the dispersion introduced by the mm-wave waveguide and can travel another short-medium distance until hitting the next repeater structure.

While the mm-wave waveguide is primarily dispersion limited, some losses may occur (e.g., during transitions between the mm-wave waveguide and the repeater). Accordingly, in some embodiments the repeater 180 may include one or more amplifiers 189 (with a positive gain) that may be used to compensate for any losses in the signal. In an embodiment, the amplifiers 189 may also operation at RF frequencies so that no down conversion is needed. In an embodiment, the amplifier 189 may be a discrete die from the analog filters 187, or the amplifiers 189 and the analog filters 187 may be fabricated on a single die. Furthermore, it is to be appreciated that not all repeaters 180 within a single interconnect need to include an amplifier 189. In some embodiments a single amplifier 189 may be needed along the entire interconnect to account for losses. For example, the amplifier 189 may be located in the first repeater 180, or at any of the subsequent repeaters. In an embodiment, an amplifier 189 may be located at every other repeater 180, at every third repeater, or the like. In an embodiment, the analog filters 187 and the amplifiers 189 may be formed on any suitable semiconductor material. For example, the dies may be silicon dies, III-V material dies, silicon on insulator (SOI) dies, III-V materials integrated on a single die with silicon, or any other combination of semiconductor materials.

Additional embodiments of the invention may utilize repeaters that are passive. Passive repeaters may compensate for the dispersion without the need for power to be provided to the repeater. Similar to the active repeaters described above, passive repeaters may also perform a dispersion compensation technique directly in the RF frequencies.

Figure 2A:
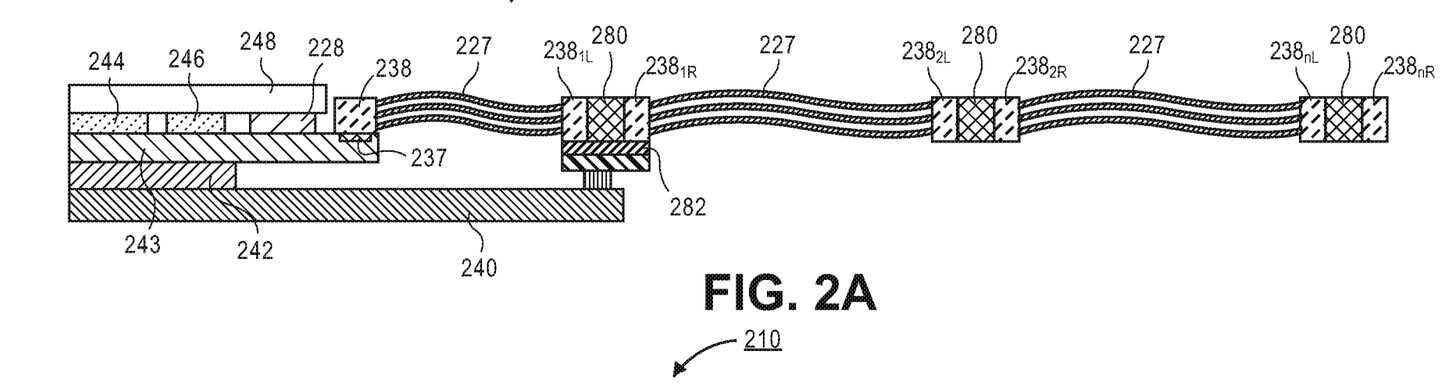
FIG. 2A is cross-sectional illustration of a mm-wave waveguide with passive repeaters that is attached to a server, according to an embodiment of the invention.
Figure 2B:
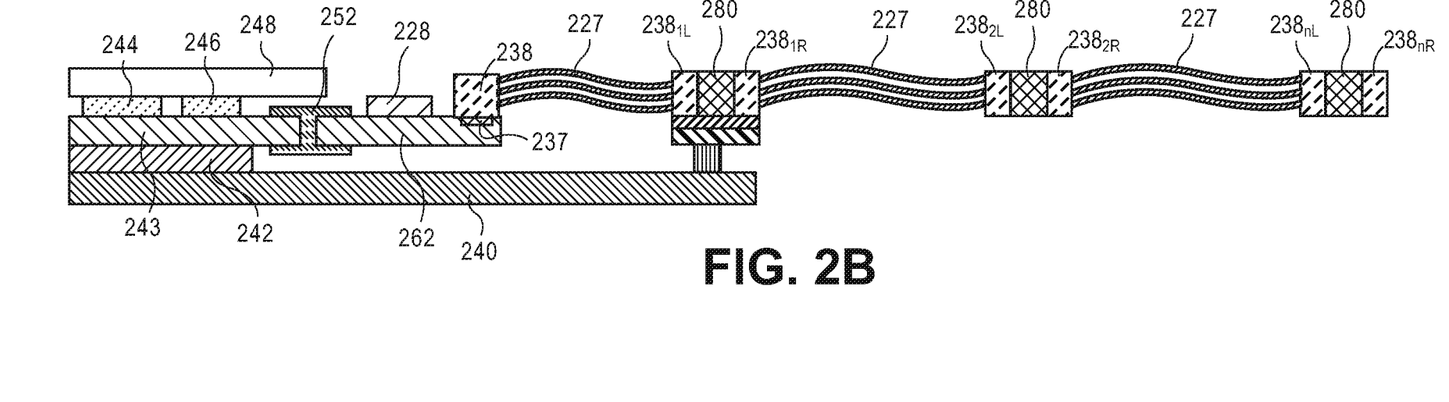
FIG. 2B is a cross-sectional illustration of a mm-wave waveguide with passive repeaters that is attached to a server, according to an additional embodiment of the invention.

FIGS. 2A and 2B provide two examples of server systems with mm-wave waveguide interconnects that include passive repeaters, according to an embodiment of the invention. In FIG. 2A the architecture of the server 210 is substantially similar to the server 110 described above with respect to FIG. 1A, and in FIG. 2B the architecture of the server 210 is substantially similar to the server 110 described in FIG. 1B. However, the mm-wave waveguide interconnect in each figure include passive repeaters 180 instead of active repeaters. Since the repeaters 180 are passive, embodiments of the invention do not require that power be supplied to each repeater 180. Accordingly, the power line 131 may be omitted. Additionally, passive repeaters 180 in FIGS. 2A and 2B are not shown as being formed on a packaging substrate. The packaging substrate may be omitted because the passive repeaters 180 do not require semiconducting dies.

According to an embodiment, the passive repeaters 180 may include transmission lines that provide a negative dispersion response compared to the mm-wave waveguide. In one embodiment, illustrated in FIG. 2C, the transmission lines 293 may be microstrip lines. The transmission lines may be formed over a substrate 291 or embedded within a substrate 291. In an embodiment, each transmission line 293 extends from a first mm-wave waveguide connector $238_L$ formed on the substrate 291 to a second mm-wave waveguide connector $238_R$ formed on an opposite end of the substrate 291. While not shown in FIG. 2C, it is to be appreciated that the mm-waveguide connectors 238 may also include a launcher for initiating the propagation of the signal along the transmission lines 293 and along the next mm-wave waveguide after the signal passes the transmission line 293.

Figure 2C:
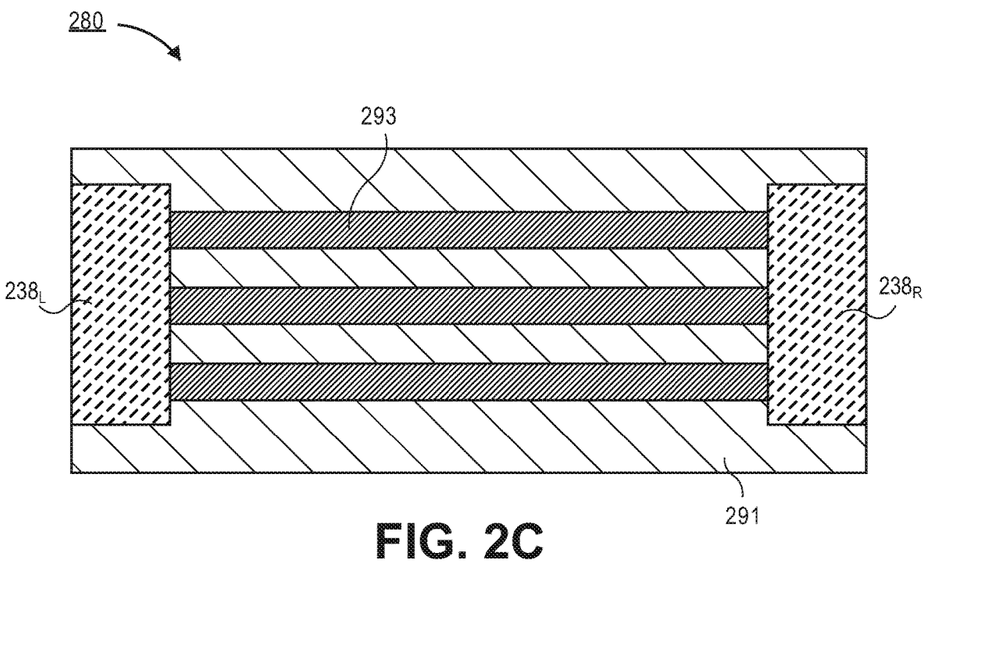
FIG. 2C is a plan view illustration of a passive repeater that includes microstrip lines that may be used to extend the range of a mm-wave waveguide, according to an embodiment of the invention.

As a signal passes through the microstrip line 293, the signal is modified by the negative dispersion response produced by the microstrip line 293. In an embodiment, the negative dispersion response may be sufficient to restore the signal to its original state. In additional embodiments, the negative dispersion response may negate only a portion of the dispersion response. For example, the dispersion per unit length achievable using microstrip lines that have a uniform width may be about 0.5 ps/GHz.cm. Accordingly, increasing the overall length of the transmission line may provide more dispersion correction.

Figure 2D:
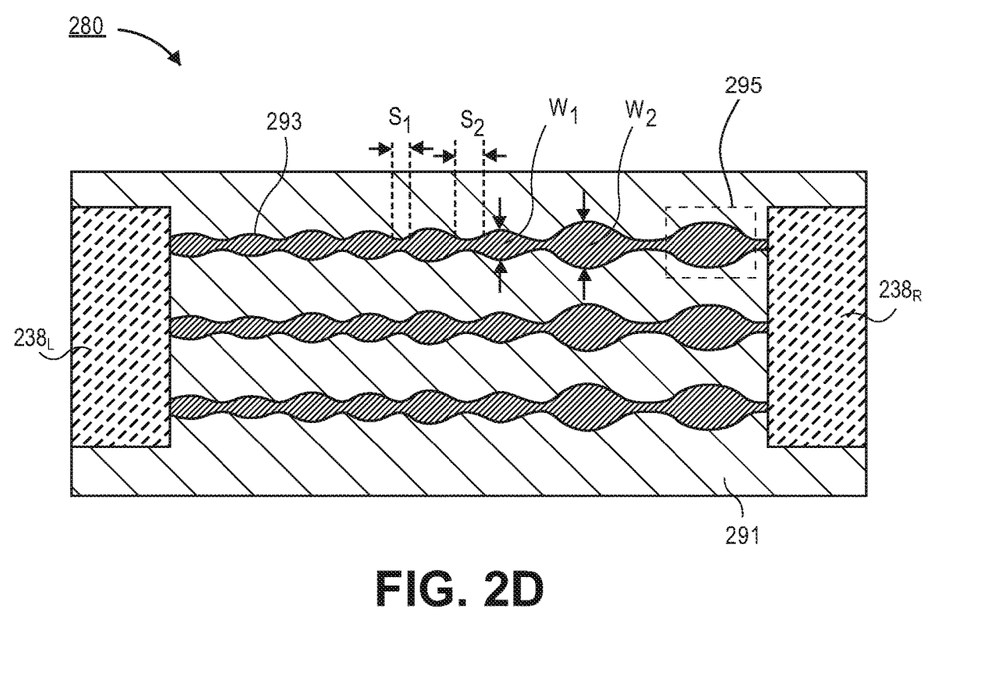
FIG. 2D is a plan view illustration of a passive repeater that includes chirped microstrip lines that may be used, to extend the range of a mm-wave waveguide, according to an embodiment of the invention.

In order to provide a more aggressive dispersion correction, embodiments may include transmission lines 293 that do not have a substantially uniform width. Such an embodiment is illustrated in FIG. 2D. In an embodiment, the transmission line 293 may be engineered to further enhance the dispersion correction in the signal. One way of enhancing the dispersion correction is to form a transmission line 293 that has a variable impedance across its length. In a particular embodiment, a chirped microstrip line 293 may provide an impedance that varies across its length. A chirped microstrip line 293 may include a plurality of bulges 295 that progressively increase in width. For example, a first width $W_1$ of a bulge 295 may be less than a second width $W_2$ of a subsequent bulge 295. In an embodiment, the spacing between each bulge 295 may also be non-uniform. In one embodiment, the spacing between the bulges 295 may progressively increase. For example, a first spacing $S_1$ between bulges 295 may be less than a subsequent spacing $S_2$ between bulges 295.

In an embodiment, a chirped microstrip line 293 may provide a dispersion correction up to 6 ps/GHz.cm. For example a 2 cm chirped transmission line 293 can achieve a 1.2 ns dispersion at an RF frequency of 100 GHz. Accordingly, the desired dispersion correction may be obtained in a transmission line that is shorter compared to the uniform width transmission line 293 described with respect to FIG. 2C. In an embodiment, the dispersion correction provided by a chirped microstrip line 293 may substantially reverse all of the dispersion that occurs in the mm-wave waveguide. In an alternative embodiment, the chirped transmission line 293 may not substantially reverse all of the dispersion that occurs in the mm-wave waveguide.

Figure 3A:
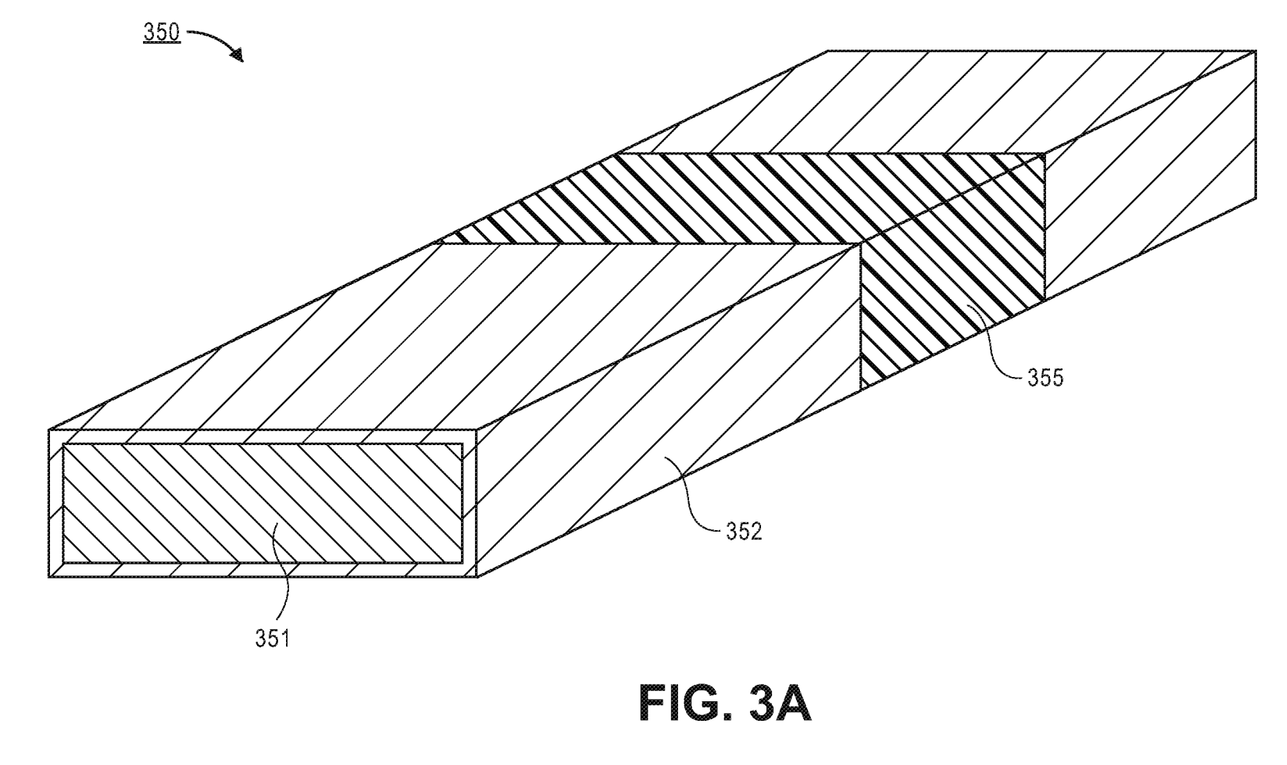
FIG. 3A is a perspective view of a mm-wave waveguide that includes a passive repeater that includes a dispersion compensating material that may be used to extend the range of a mm-wave waveguide, according to an embodiment of the invention.

According to an additional embodiment of the invention, a passive repeater may also include a dispersion compensating materials that is integrated directly into the mm-wave waveguide. A perspective illustration of a mm-waveguide 350 according to such an embodiment is illustrated in FIG. 3A. In an embodiment, the mm-wave waveguide 350 may include a dielectric core material 351 that is surrounded by a conductive material 352 that provides electrical shielding. Instead of a discrete repeater, such as those described above, a passive repeater that includes the dispersion compensating material 355 may be integrated into the mm-wave waveguide 350. As illustrated, the dispersion compensating material 355 may be formed between adjacent portions of the dielectric material 351. In an embodiment, the signal may pass through the dielectric material 351 and become dispersed. Upon passing through the section including the dispersion compensating material 355, the dispersion may be substantially reversed by the dispersion compensating material 355 and the signal is substantially restored to its original form. In some embodiments, the dispersion compensating material 355 may partially cancel the dispersion produced by the dielectric material 351 in the mm-wave waveguide 350.

As used herein, a dispersion compensating material 355 may be a material that is engineered to provide a dispersion response that is substantially opposite to the dispersion response produced in the dielectric material 351. In an embodiment, a dispersion compensating material may be a metamaterial. Metamaterials are engineered materials that exhibit properties not usually found in natural materials. In a particular embodiment, metamaterials used according to embodiments of the invention may include dielectric constant (Dk) values that are not otherwise obtainable in naturally occurring materials. For example, metamaterials may include a negative Dk-value. A negative Dk-value material may provide a dispersion response for a signal with a given bandwidth that is substantially opposite to the dispersion response produced by the mm-wave waveguide. Accordingly, as the signal propagates along the mm-wave waveguide 350, the effects of the dispersion responses produced by the dielectric material 351 and the dispersion compensating material 355 substantially cancel, and the signal remains substantially unaltered.

In FIG. 3A the dispersion compensating material 355 is shown as a generic block of material. However, embodiments of the invention may include dispersion compensating materials that include any suitable material or composite material that has been developed to counteract the dispersion response produced by a dielectric material used in the mm-wave waveguide. In some embodiments, the dispersion compensating material may include patterned structures that interact with the signal. For example, the patterned structures may be smaller than the wavelength of the propagated signal. According to an embodiment, the dispersion compensating material may include any patterned structures that provide the desired dispersion response.

Figure 3B:
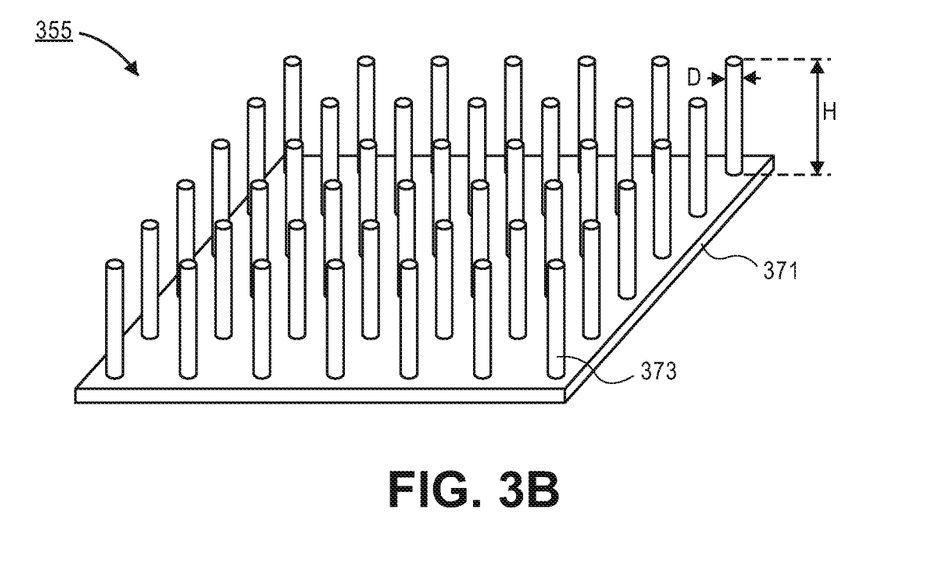
FIG. 3B is a perspective view of a dispersion compensating material that includes a plurality of rods extending from a ground pad, according to an embodiment of the invention.

In one embodiment illustrated in FIG. 3B, the patterned structures of the dispersion compensating material may include repeating patterns of rods 373 that extend up from a plate 371. The rods 373 may be sized to interact with the propagated mm-wave signals. For example, the height H of the rods 373 may be several microns, tens of microns, or hundreds of microns. The diameter D of the rods 373 may be chosen so that the rods are high aspect ratio rods 373. For example, the rods 373 may have an aspect ratio of 10:1, 100:1, or greater. In an embodiment, each of the rods 373 may substantially similar dimensions. Alternative embodiments may include rods 373 that do not have the same dimensions. Additional embodiments of the invention may also include high aspect ratio features other than cylindrical rods 373. For example, the rods 373 may have cross-sections that are rectangular, square, elliptical, or any other shape.

In an embodiment, a dielectric material (not shown) may be formed over and between the rods 373. For example, the dielectric material may be the same dielectric material 351 used to form the mm-wave waveguide channel. In an embodiment, the dielectric material may be a different dielectric material than the dielectric material 351 used to form the mm-wave waveguide channel. For example, the rods 373 and the pad 371 may be formed (e.g., with a 3D printing process) and thereafter, the dielectric material may be overmolded over the printed structures. In an additional embodiment, the dielectric material may be formed into a channel and the rods may be pressed into existing dielectric material (e.g., with a crimping process).

Figure 3C:
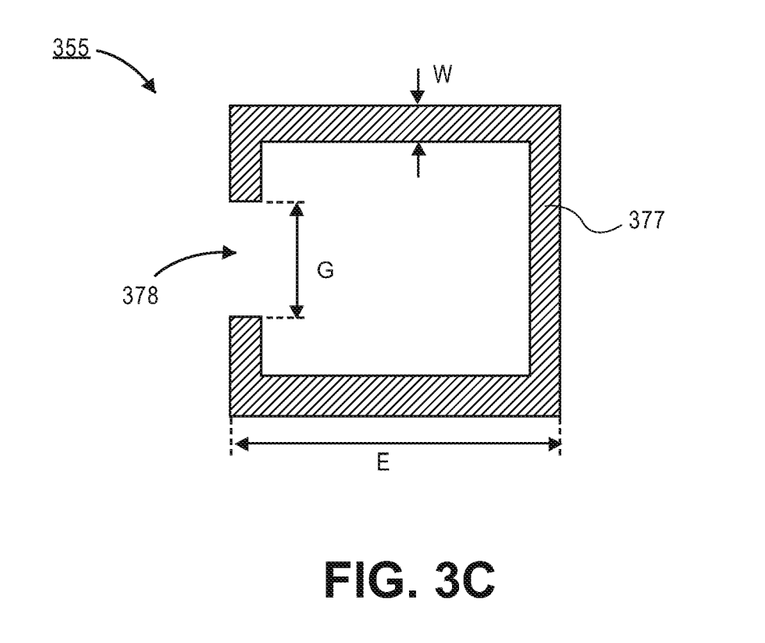
FIG. 3C is a plan view illustration of a dispersion compensating material that includes a split-ring resonator, according to an embodiment of the invention.

In an additional embodiment of the invention, the dispersion compensating material 355 may include patterned structures that form sub-wavelength resonators, such as omega cell resonators or split-ring resonators. An example of one such resonator is illustrated in FIG. 3C. The split ring resonator 355 may include a ring 377 that has an opening 378 formed along one edge of the ring 377. In an embodiment, the ring may have a width W that is several microns, to tens of microns wide. Similarly, the length of each edge E of the ring 377 may be several microns, tens of microns, or hundreds of microns wide. While illustrated as being substantially equal, the length of each edge E does not have to be equal in every embodiment. In an embodiment the opening 378 may form a gap that has a length G that is between approximately 5% and 95% of the length of an edge E. In an additional embodiment, the length G of the opening 378 may be between approximately 30% and 70% of the length of an edge E. Furthermore, while the outer perimeter of the ring is substantially square shaped, embodiments are not limited to such configurations. For example the outer perimeter of the ring 377 may be rectangular, circular, or any other desired shape.

According to an embodiment the dispersion compensating material may include a plurality of resonators. For example, a plurality of rings 377 may be formed in a repeating pattern. Embodiments of the invention may include orienting the resonators so that each of the rings 377 are transverse to the direction of signal propagation. In an alternative embodiment, the each of the rings 377 may be oriented parallel to the direction of signal propagation. In an additional embodiment, one or more of the rings 377 may be substantially transverse to the direction of signal propagation and one or more of the rings 377 may be substantially parallel to the direction of signal propagation. In an additional embodiment, the one or more rings 377 may be placed in different planes transverse to the direction of signal propagation. For example, at one or more transverse cross-sections there may be a plurality of rings 377 formed in an array. According to an embodiment, the spacing between each of the plurality of rings 377 may be substantially uniform. Additional embodiment may include non-uniform spacing between the plurality of rings 377.

In an embodiment, a dielectric material (not shown) may be disposed over each of the rings 377. For example, the dielectric material may be the same dielectric material 351 used to form the mm-wave waveguide channel. In an embodiment, the dielectric material may be a different dielectric material than the dielectric material 351 used to form the mm-wave waveguide channel.

Figure 4:
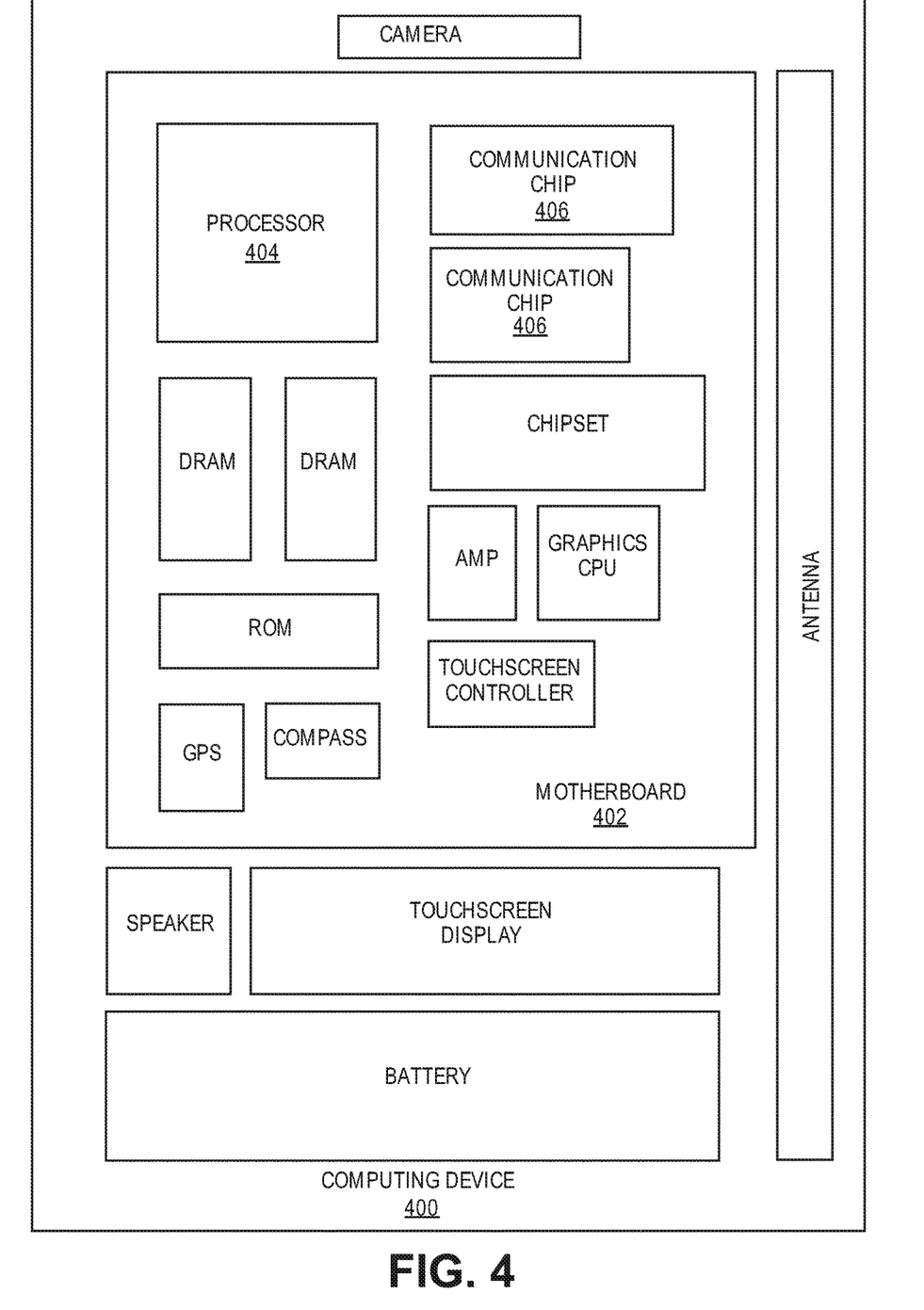
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be packaged on an organic substrate and provide signals that are propagated along a mm-wave waveguide that includes one or more active or passive repeaters, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be packaged on an organic substrate and provide signals that are propagated along a mm-wave waveguide that includes one or more active or passive repeaters, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a mm-wave waveguide comprising: a first dielectric waveguide;

a second dielectric waveguide; a conductive layer covering the first dielectric waveguide and the second dielectric waveguide; and a repeater communicatively coupled between the first dielectric waveguide and the second dielectric waveguide.

Example 2: the mm-wave waveguide of Example 1, wherein the repeater is an active repeater.

Example 3: the mm-wave waveguide of Example 2, wherein the active repeater includes one or more semiconducting dies packaged on a repeater substrate.

Example 4: the mm-wave waveguide of Example 3, wherein the first dielectric waveguide is communicatively coupled to the repeater with a first mm-wave waveguide connector formed on the repeater substrate, and wherein the second dielectric waveguide is communicatively coupled to the repeater by a second mm-wave waveguide connector formed on the repeater substrate.

Example 5: the mm-wave waveguide of Example 3 or Example 4, wherein the one or more semiconducting dies include an analog filter.

Example 6: the mm-wave waveguide of Example 5, wherein the analog filter is an RF analog filter.

Example 7: the mm-wave waveguide of Example 5 or Example 6, wherein the one or more semiconducting dies further includes an RF amplifier.

Example 8: the mm-wave waveguide of Example 7, wherein the RF analog filter and the RF amplifier are formed on a single die.

Example 9: the mm-wave waveguide of Example 2, Example 3, Example 4, Example 5, Example 6, Example 7, or Example 8, further comprising: a power supply line electrically coupled to the repeater.

Example 10: the mm-wave waveguide of Example 1, wherein the repeater is a passive repeater.

Example 11: the mm-wave waveguide of Example 10, wherein the repeater includes one or more transmission lines formed on a substrate.

Example 12: the mm-wave waveguide of Example 11, wherein the one or more transmission lines are microstrip lines, wherein a width of each microstrip line is substantially uniform.

Example 13: the mm-wave waveguide of Example 11, wherein the one or more transmission lines are chirped microstrip lines.

Example 14: the mm-wave waveguide of Example 13, wherein each of the chirped microstrip lines includes a non-uniform impedance.

Example 15: the mm-wave waveguide of Example 13 or Example 14, wherein each chirped microstrip line includes a plurality of bulges, wherein the plurality of bulges do not have a uniform width.

Example 16: the mm-wave waveguide of Example 1, Example 2, Example 3, Example 4, Example 5, Example 6, Example 7, Example 8, Example 9, Example 10, Example 11, Example 12, Example 13, Example 14, or Example 15, wherein a total length of the first dielectric waveguide and the second dielectric waveguide is greater than approximately 5 meters.

Example 17: a mm-wave waveguide comprising: a dielectric waveguide; a conductive layer covering the dielectric waveguide; and a passive repeater integrated within the dielectric waveguide, wherein the passive repeater includes a dispersion compensating material, and wherein the dispersion compensating material produces a dispersion response in a signal that is substantially opposite to a dispersion response produced when the signal is propagated along the dielectric waveguide.

Example 18: the mm-wave waveguide of example 17, wherein the dispersion compensating material is a metamaterial.

Example 19: the mm-wave waveguide of Example 18, wherein the metamaterial includes a plurality of rods, wherein the rods extend from a pad.

Example 20: the mm-wave waveguide of Example 19, wherein the plurality of rods are high aspect ratio rods.

Example 21: the mm-wave waveguide of Example 19 or Example 20, further comprising:

a dielectric material disposed around and over the plurality of rods.

Example 22: the mm-wave waveguide of Example 18, wherein the metamaterial includes a plurality of split-ring resonators or omega resonators.

Example 23: the mm-wave waveguide of Example 22, wherein the plurality of resonators are oriented so that they are substantially transverse or perpendicular to a direction that a signal propagates along the mm-wave waveguide.

Example 24: a computing system, comprising: a server, comprising: a printed circuit board (PCB); a central processing unit (CPU) die packaged on a CPU packaging substrate, wherein the CPU packaging substrate is electrically coupled to the PCB; and a mm-wave engine packaged on a mm-wave engine packaging substrate, wherein the mm-wave engine packaging substrate is coupled to the CPU packaging substrate with a predefined digital interface; and a mm-wave waveguide communicatively coupled to the mm-wave engine, wherein the mm-wave waveguide, comprises: a first dielectric waveguide; a second dielectric waveguide; a conductive layer covering the first dielectric waveguide and the second dielectric waveguide; and a repeater communicatively coupled between the first dielectric waveguide and the second dielectric waveguide, wherein the repeater is a passive repeater or an active repeater, and wherein a total length of the mm-wave waveguide is greater than 5 meters.

Example 25: the computing system of Example 24, wherein the a passive repeater comprises one or more chirped microstrip lines, and wherein the active repeater comprises an RF analog filter and an RF amplifier.

What is claimed is:

1. A mm-wave waveguide comprising: a first dielectric waveguide; a second dielectric waveguide; a conductive layer surrounding the first dielectric waveguide and the second dielectric waveguide; and a repeater communicatively coupled between the first dielectric waveguide and the second dielectric waveguide.

2. The mm-wave waveguide of claim 1, wherein the repeater is an active repeater.

3. The mm-wave waveguide of claim 2, wherein the active repeater includes one or more semiconducting dies packaged on a repeater substrate.

4. The mm-wave waveguide of claim 3, wherein the first dielectric waveguide is communicatively coupled to the repeater with a first mm-wave waveguide connector formed on the repeater substrate, and wherein the second dielectric waveguide is communicatively coupled to the repeater by a second mm-wave waveguide connector formed on the repeater substrate.

5. The mm-wave waveguide of claim 3, wherein the one or more semiconducting dies include an analog filter.

6. The mm-wave waveguide of claim 5, wherein the analog filter is an RF analog filter.

7. The mm-wave waveguide of claim 5, wherein the one or more semiconducting dies further includes an RF amplifier.

8. The mm-wave waveguide of claim 7, wherein the RF analog filter and the RF amplifier are formed on a single die.

9. The mm-wave waveguide of claim 2, further comprising:
a power supply line electrically coupled to the repeater.

10. The mm-wave waveguide of claim 1, wherein the repeater is a passive repeater.

11. The mm-wave waveguide of claim 10, wherein the repeater includes one or more transmission lines formed on a substrate.

12. The mm-wave waveguide of claim 11, wherein the one or more transmission lines are microstrip lines, wherein a width of each microstrip line is substantially uniform.

13. The mm-wave waveguide of claim 11, wherein the one or more transmission lines are chirped microstrip lines.

14. The mm-wave waveguide of claim 13, wherein each of the chirped microstrip lines includes a non-uniform impedance.

15. The mm-wave waveguide of claim 13, wherein each chirped microstrip line includes a plurality of bulges, wherein the plurality of bulges do not have a uniform width.

16. The mm-wave waveguide of claim 1, wherein a total length of the first dielectric waveguide and the second dielectric waveguide is greater than approximately 5 meters.

17. A mm-wave waveguide comprising:
a dielectric waveguide;
a conductive layer covering the dielectric waveguide; and
a passive repeater integrated within the dielectric waveguide, wherein the passive repeater includes a dispersion compensating material, and wherein the dispersion compensating material produces a dispersion response in a signal that is substantially opposite to a dispersion response produced when the signal is propagated along the dielectric waveguide.

18. The mm-wave waveguide of claim 17, wherein the dispersion compensating material is a metamaterial.

19. The mm-wave waveguide of claim 18, wherein the metamaterial includes a plurality of rods, wherein the rods extend from a pad.

20. The mm-wave waveguide of claim 19, wherein the plurality of rods are high aspect ratio rods.

21. The mm-wave waveguide of claim 19, further comprising:
a dielectric material disposed around and over the plurality of rods.

22. The mm-wave waveguide of claim 18, wherein the metamaterial includes a plurality of split-ring resonators or omega resonators.

23. The mm-wave waveguide of claim 22, wherein the plurality of resonators are oriented so that they are substantially transverse or perpendicular to a direction that a signal propagates along the mm-wave waveguide.

24. A computing system, comprising:
a server, comprising:
a printed circuit board (PCB);
a central processing unit (CPU) die packaged on a CPU packaging substrate, wherein the CPU packaging substrate is electrically coupled to the PCB; and
a mm-wave engine packaged on a mm-wave engine packaging substrate, wherein the mm-wave engine packaging substrate is coupled to the CPU packaging substrate with a predefined digital interface; and
a mm-wave waveguide communicatively coupled to the mm-wave engine, wherein the mm-wave waveguide, comprises:
a first dielectric waveguide;
a second dielectric waveguide;
a conductive layer covering the first dielectric waveguide and the second dielectric waveguide; and
a repeater communicatively coupled between the first dielectric waveguide and the second dielectric waveguide, wherein the repeater is a passive repeater or an active repeater, and wherein a total length of the mm-wave waveguide is greater than 5 meters.

25. The computing system of claim 24, wherein the passive repeater comprises one or more chirped microstrip lines, and wherein the active repeater comprises an RF analog filter and an RF amplifier.

* * * * *